United States Patent
Hirose et al.

(10) Patent No.: US 11,659,769 B2
(45) Date of Patent: May 23, 2023

(54) PIEZOELECTRIC COMPOSITION AND PIEZOELECTRIC ELEMENT

(71) Applicant: TDK CORPORATION, Tokyo (JP)

(72) Inventors: Masakazu Hirose, Tokyo (JP); Yuiko Hirose, Tokyo (JP); Hiroki Katoh, Tokyo (JP)

(73) Assignee: TDK CORPORATION, Tokyo (JP)

( * ) Notice: Subject to any disclaimer, the term of this patent is extended or adjusted under 35 U.S.C. 154(b) by 775 days.

(21) Appl. No.: 16/497,052

(22) PCT Filed: Mar. 20, 2018

(86) PCT No.: PCT/JP2018/011037
§ 371 (c)(1),
(2) Date: Sep. 24, 2019

(87) PCT Pub. No.: WO2018/180770
PCT Pub. Date: Oct. 4, 2018

(65) Prior Publication Data
US 2020/0243748 A1  Jul. 30, 2020

(30) Foreign Application Priority Data
Mar. 28, 2017 (JP) .............................. JP2017-062381

(51) Int. Cl.
*H01L 41/187* (2006.01)

(52) U.S. Cl.
CPC ....... *H10N 30/8542* (2023.02); *H10N 30/072* (2023.02); *H10N 30/50* (2023.02); *H10N 30/097* (2023.02)

(58) Field of Classification Search
CPC . H01L 41/1873; H01L 41/083; H01L 41/312; H01L 41/43; H01L 41/273; C04B 35/6262; C04B 35/62645; C04B 35/62695; C04B 35/63416; C04B 35/638; C04B 35/64; C04B 2235/3201; C04B 2235/3251; C04B 2235/3267; C04B 2235/3281; C04B 2235/442; C04B 2235/604;
(Continued)

(56) References Cited

FOREIGN PATENT DOCUMENTS

| CN | 1914136 A | 2/2007 |
|---|---|---|
| CN | 102070337 B | * 12/2012 |
| JP | S49-056198 A | 5/1974 |

(Continued)

OTHER PUBLICATIONS

"Piezoelectric and ferroelectric properties of KxNa1—xNbO3 lead-free ceramics with MnO2 and CuO doping", Lin et al., Journal of Alloys and Compounds 461, Aug. 6, 2007, pp. 273-278 (Lin) (Year: 2008).*

(Continued)

*Primary Examiner* — Humera N. Sheikh
*Assistant Examiner* — Kevin C T Li
(74) *Attorney, Agent, or Firm* — Oliff PLC

(57) ABSTRACT

A piezoelectric composition including manganese and a complex oxide having a perovskite structure represented by a general formula $ABO_3$, wherein an A site element in the $ABO_3$ is potassium or potassium and sodium, a B site element in the $ABO_3$ is niobium, a concentration distribution of the manganese has a variation, and the variation shows a CV value of 35% or more and 440% or less.

8 Claims, 2 Drawing Sheets

(58) Field of Classification Search
CPC ...... C04B 2235/6567; C04B 2235/768; C04B 2235/79; C04B 2235/495
See application file for complete search history.

(56) References Cited

FOREIGN PATENT DOCUMENTS

| | | |
|---|---|---|
| JP | S49-65198 A | 6/1974 |
| JP | H06-001655 A | 1/1994 |
| JP | 2014-177355 A | 9/2014 |

OTHER PUBLICATIONS

"Piezoelectric and ferroelectric properties of KxNa1—xNbO3 lead-free ceramics with MnO2 and CuO doping", Lin et al., Journal of Alloys and Compounds 461, Aug. 6, 2007, pp. 273-278 (Lin) (Year: 2007).*

Jun. 5, 2018 International Search Report issued in International Patent Application No. PCT/JP2018/011037.

Oct. 1, 2019 International Preliminary Report on Patentability issued in International Patent Application No. PCT/JP2018/011037.

Lin et al. "Piezoelectric and ferroelectric properties of KxNA1—xNbO3 lead-free ceramics with MnO2 and CuO doping." Journal of Alloys and Compounds, Aug. 6, 2007, vol. 461, pp. 273-278.

Matsumoto et al. "Electric-field-induced strain in Mn-doped KNbO3 ferroelectric ceramics." Cermaics International, vol. 34, Oct. 4, 2007, pp. 787-791.

Nagata et al. "Fabrication and Electrical Properties of Mn-Doped KNbO3 Ceramics Synthesized from KHCO3 as a Starting Material." Japanese Journal of Applied Physics, Sep. 20, 2012, vol. 51, 09LD05.

* cited by examiner

PIEZOELECTRIC COMPOSITION AND PIEZOELECTRIC ELEMENT

BACKGROUND OF THE INVENTION

The present invention relates to a piezoelectric composition and a piezoelectric element having thereof.

The piezoelectric composition has, based on a spontaneous polarization due to bias of an electric charge in crystals, an effect (a piezoelectric effect) of generating electric charge on the surface due to receiving an external stress and an effect (a converse piezoelectric effect) of generating distortion due to an application of an external electric field.

Piezoelectric elements to which such piezoelectric compositions, capable of mutually converting mechanical displacement and electrical displacement, are applied are widely used in various fields. For example, an actuator as the piezoelectric element utilizing the converse piezoelectric effect, in relative to an applied voltage, can provide a minute displacement with a high precision and has a fast response speed. Therefore, the actuator can be used for driving e.g. an optical system component, an HDD head, an ink jet printer head, and a fuel injection valve.

It is also used as a sensor for reading a minute force or deformation amount using the piezoelectric effect. Furthermore, since the piezoelectric composition has an excellent responsiveness, resonance can also be caused by exciting the piezoelectric composition itself or an elastic body that is connected with the piezoelectric composition by applying an AC electric field. Therefore, it is also used as a piezoelectric transformer, an ultrasonic motor, etc.

In general, the piezoelectric composition is composed of a polycrystalline substance and is obtained by subjecting a poling processing to the fired ferroelectric composition. In the ferroelectric composition after firing, the direction of spontaneous polarization in each crystal is random. And the ferroelectric composition as a whole has no bias of the electric charge and does not exhibit the piezoelectric effect or the converse piezoelectric effect. Therefore, by applying a DC electric field higher than the coercive electric field to the fired ferroelectric composition, an operation called poling processing in which the direction of spontaneous polarization is aligned in a certain direction is performed. The ferroelectric composition after the poling processing can exhibit properties as the piezoelectric composition.

As the piezoelectric composition, a lead based piezoelectric composition composed of lead zirconate ($PbZrO_3$) and lead titanate ($PbTiO_3$) is frequently used. However, the lead-based piezoelectric composition contains about 60 to 70 wt % of lead oxide (PbO) having a low melting point, and lead oxide easily volatilizes during firing. Therefore, from a viewpoint of environmental burden, development of a lead-free piezoelectric composition is an extremely important task.

On the other hand, a research on an alkali metal niobate based compound has recently progressed as an eco-friendly lead-free piezoelectric composition. For example, the following Patent Document 1 discloses a piezoelectric composition having a main phase of an alkali metal niobate based compound, and further having a first oxide phase including Si, and a second oxide phase including a Group 2 element and a Group 4 element.

Patent Document 1: JP Unexamined Patent Application No. 2014-177355

BRIEF SUMMARY OF INVENTION

In order to realize a high performance and a downsizing of an apparatus in which the piezoelectric element including the piezoelectric composition is mounted, it is necessary to reduce the size of the piezoelectric element while maintaining the performances of the piezoelectric element. In this case, it is also necessary to reduce the size of the piezoelectric composition, however, the mechanical strength of the piezoelectric composition decreases as the size of the piezoelectric composition reduces. If the mechanical strength is lowered, defective products may be generated during processing the piezoelectric composition. Thus, the piezoelectric composition is required to have a preferable mechanical strength while having predetermined piezoelectric properties.

However, although the alkali metal niobate based compound disclosed in the above Patent Document 1 was evaluated for the electromechanical coupling coefficient, the mechanical strength was not evaluated at all. According to the alkali metal niobate based compound, the alkali metal elements volatilize during firing, and voids, defects, etc. are likely to generate inside the piezoelectric composition after firing. Therefore, it is very important that the piezoelectric composition after firing has a predetermined mechanical strength.

The invention has been made in view of such circumstances, and an object of the invention is to provide a piezoelectric composition, which can achieve both the mechanical strength and the electromechanical coupling coefficient $k_{31}$, and a piezoelectric element including the piezoelectric composition.

BRIEF SUMMARY OF INVENTION

In order to achieve the above object, a piezoelectric composition of the invention is

[1] a piezoelectric composition including manganese and a complex oxide having a perovskite structure represented by a general formula $ABO_3$, in which an A site element in the $ABO_3$ is potassium or potassium and sodium, a B site element in the $ABO_3$ is niobium, a concentration distribution of the manganese has a variation, and the variation shows a CV value of 35% or more and 440% or less.

[2] The piezoelectric composition according to [1], in which the $ABO_3$ is represented by a compositional formula $(K_xNa_y)NbO_3$, and x and y in the compositional formula satisfy $0.500 \le x \le 1.005$, $y \le 0.500$, and $0.980 \le x+y \le 1.005$.

[3] The piezoelectric composition according to [1] or [2], in which the manganese is included in z mol % in terms of $MnO_2$ with respect to 1 mol of the complex oxide, and z satisfies $0.50 \le z \le 2.50$.

[4] The piezoelectric composition according to any one of [1] to [3] including copper, in which the copper is included in n mol % in terms of CuO with respect to 1 mol of the complex oxide, and n satisfies $0.20 \le n \le 0.80$.

[5] A piezoelectric element including the piezoelectric composition according to any one of [1] to [4].

In case when the piezoelectric composition according to the invention has the above properties, it is possible to provide a piezoelectric composition, that can satisfy both the mechanical strength and the electromechanical coupling coefficient $k_{31}$, and a piezoelectric element including the piezoelectric composition.

Hereinafter, the invention will be described in detail based on specific embodiments in the following order.
1. Piezoelectric element
    1.1 Piezoelectric composition
2. Method of producing piezoelectric element
3. Effects in the embodiment
4. Modified embodiments 1. Piezoelectric Element First, a piezoelectric element to which the piezoelectric composition according to the embodiment is applied will be described. The piezoelectric element is not particularly limited as long as it is an element to which the piezoelectric composition according to the embodiment can be applied. In the embodiment, a piezoelectric transformer, a thin film sensor, and a piezoelectric ultrasonic motor, etc. are exemplified.

Figure 1:
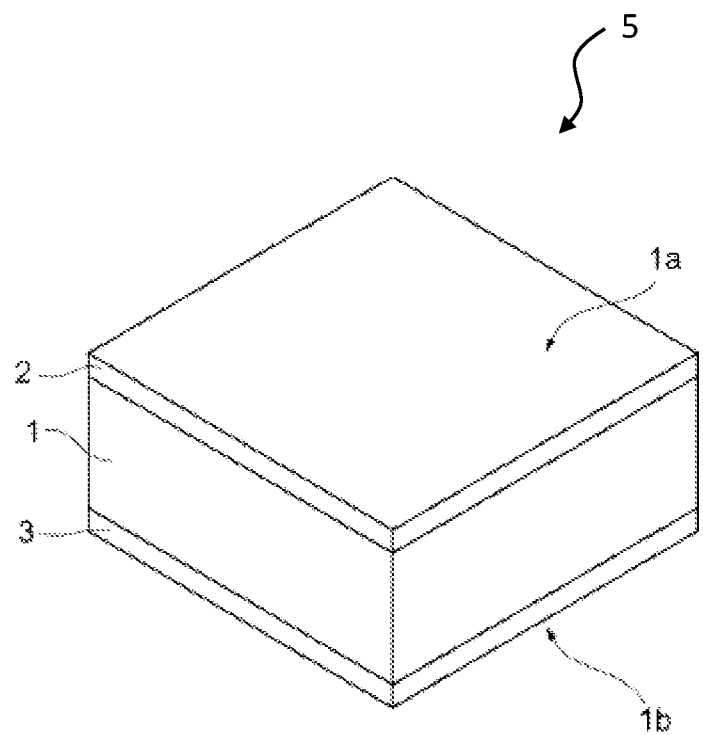
FIG. 1 is a schematic perspective view of an example of a piezoelectric element according to the embodiment.

The piezoelectric element 5 shown in FIG. 1 includes a plate-shaped piezoelectric part 1 and a pair of electrodes 2 and 3 formed on a pair of opposing surfaces 1a and 1b, which are both main surfaces of the piezoelectric part 1. The piezoelectric part 1 includes the piezoelectric composition according to the embodiment. Details of the piezoelectric composition will be described later. The conductive material contained in the electrodes 2, 3 is not particularly limited, and can be arbitrarily set according to desired properties, use, etc. Gold (Au), silver (Ag), palladium (Pd), etc. are exemplified in the embodiment.

Although the piezoelectric part 1 has a rectangular parallelepiped shape in FIG. 1, the shape of the piezoelectric part 1 is not particularly limited and can be arbitrarily set according to desired properties, use, etc. In addition, the size of the piezoelectric part 1 is not particularly limited, and can be arbitrarily set according to desired properties, use, etc.

The piezoelectric part 1 is poled in a predetermined direction. For example, in the piezoelectric element 5 shown in FIG. 1, it is polarized in the thickness direction of the piezoelectric part 1, namely, it is polarized in the direction in which the electrodes 2 and 3 are opposed. For instance, an external power supply (not shown) is electrically connected to the electrodes 2, 3, via wires or the like (not shown), and a predetermined voltage is applied to the piezoelectric part 1 via the electrodes 2, 3. When voltage is applied, an electrical displacement is converted into a mechanical displacement by the converse piezoelectric effect in the piezoelectric part 1, and the piezoelectric part 1 can laterally vibrate in a lateral direction.

(1.1 Piezoelectric Composition)

The piezoelectric composition according to the embodiment includes the complex oxide having a perovskite structure represented by a general formula $ABO_3$ as a main component. According to the embodiment, the main component is 90 mol % or more with respect to 100 mol % of the piezoelectric composition.

In the perovskite structure, an element having a large ion radius such as alkali metal elements, alkaline earth metal elements tend to occupy an A site of $ABO_3$ while an element having a small ion radius such as transition metal elements tend to occupy a B site of $ABO_3$. Then, the $BO_6$ oxygen octahedra including the B site element and oxygen constitute a three-dimensional network in which the apexes of the $BO_6$ oxygen octahedra are shared, and the perovskite structure is formed by filling the A site element in the interstitial site of the network.

In the embodiment, the general formula $ABO_3$ can be represented by a compositional formula $(K_xNa_y)NbO_3$. That is, the A site element is potassium (K) and sodium (Na), and the B site element is niobium (Nb).

In the above compositional formula, "x" indicates a ratio of the number of K atoms at the A site. On the other hand, "y" indicates a ratio of the number of Na atoms at the A site. Therefore, "x+y" in the above compositional formula indicates a ratio of the total number of A site element with respect to that of B site element, so-called an AB ratio. That is, it is a ratio of a sum of the number of K atoms and the number of Na atoms with respect to the total number of Nb atoms. In the embodiment, "x+y" preferably satisfies $0.980 \leq x+y \leq 1.005$. Further, "x+y" is more preferably 0.991 or more, and furthermore preferably 0.993 or more. On the other hand, "x+y" is more preferably 0.999 or less, and furthermore preferably 0.997 or less.

In the embodiment, by setting A/B ratio of the piezoelectric composition within the above range, both a high mechanical strength and an excellent electromechanical coupling coefficient $k_{31}$ thereof can be achieved.

In the embodiment, "x" preferably satisfies $0.500 \leq x \leq 1.005$. Further, "x" is more preferably 0.800 or more, and furthermore preferably 0.980 or more. On the other hand, "x" is more preferably 1.000 or less, and furthermore preferably 0.995 or less.

In the embodiment, "y" is preferably 0.500 or less, more preferably 0.190 or less, and furthermore preferably 0.100 or less. From a viewpoint of the mechanical strength of the piezoelectric composition, "y" is particularly preferably 0.000. Note that the A site element is only K when "y" is 0.000.

In addition, the piezoelectric composition according to the embodiment includes manganese (Mn). In the piezoelectric composition of the embodiment, it is preferable that Mn is present in grain boundaries between crystal grains constituting the complex oxide. The presence of Mn in the grain boundaries strengthens the bonding between the crystal grains and can increase the mechanical strength of the piezoelectric composition. Such effect becomes larger as the number of crystal grains whose bonding strength is enhanced due to dispersion of Mn at high concentration in grain boundaries becomes larger, rather than only specific bonding strength between specific crystal grains is enhanced due to the presence of Mn in specific grain boundaries.

In order to increase the number of crystal grains in which the bonding strength is enhanced, Mn does not dissolve as much as possible in the crystal grains constituting the complex oxide, and Mn preferably exist uniformly at a high concentration in the grain boundaries formed between the crystal grains. In particular, Mn is preferably present at a triple point formed between three or more crystal grains. At the triple point, the possible presence amount of Mn is larger than that at the grain boundary formed between two adjacent crystal grains. Thus, three or more crystal grains can be efficiently bonded via the triple point.

Therefore, according to the embodiment, the existence state of Mn as described above is evaluated as a variation of the Mn concentration in the piezoelectric composition. The variation can be expressed as a CV value. The CV value of the embodiment is 35% or more and 440% or less. In addition, the CV value is preferably 170% or more, more preferably 250% or more. On the other hand, the CV value is preferably 360% or less.

By setting the CV value within the above range, the mechanical strength of the piezoelectric composition can be increased. When the CV value is excessively large, many amounts of components that do not contribute to the piezoelectric properties will be present in the piezoelectric composition, making the piezoelectric properties tend to deteriorate.

The method of calculating the CV value is not particularly limited as long as it is capable to measure the Mn concentration distribution in the piezoelectric composition. According to the embodiment, the CV value can be calculated by EPMA (Electron Probe Micro Analyzer) analysis as following. An area analysis is performed on a specific area in the cut surface of the sintered piezoelectric composition using an EPMA apparatus to obtain an information on the existence amount (concentration) of Mn present at the measurement point in the area.

From the information of the obtained Mn concentration, a standard deviation σ of the Mn concentration and the average value Av of the Mn concentration at each measurement point in the area are calculated, and the CV value is calculated from the following equation.

$$CV \text{ value } (\%) = 100 \times (\sigma/Av)$$

According to the embodiment, a magnification for performing an area analysis is preferably 200 to 5000 times, and it is preferable to measure three or more fields.

An existence form is not particularly limited as long as Mn is present in the grain boundaries but is preferably present as a segregation phase including Mn. In the segregation phase, Mn may be present as an oxide of Mn or may be present as a compound with another element.

Further, according to the embodiment, in order to set the CV value within the above range, when an amount of Mn in terms of $MnO_2$ with respect to 1 mol (100 mol %) of the complex oxide is z mol %, it preferably satisfies $0.50 \leq z \leq 2.50$. Further, "z" is more preferably 0.80 or more. On the other hand, "z" is more preferably 2.00 or less.

The followings are exemplified as methods of controlling the CV value besides the range of Mn amount: the average particle diameter range of the Mn starting raw material powder, the mixing method, the pulverization conditions, the firing conditions, etc.

Furthermore, the piezoelectric composition of the embodiment may include cupper (Cu), when an amount of Cu in terms of CuO with respect to 1 mol (100 mol %) of the complex oxide is n mol %, it preferably satisfies $0.20 \leq n \leq 0.80$. Further, "n" is more preferably 0.30 or more. On the other hand, "n" is more preferably 0.75 or less.

As long as Cu is contained within the above range, there are no restrictions on its existence form. Cu is preferably dissolved in the crystal grains constituting the complex oxide according to the embodiment, however, Cu may be present in the grain boundaries together with Mn. It may form a compound with another element, when present in the grain boundary. However, it is not preferable to exist as a secondary phase, different from the crystal phase made of $(K_xNa_y)NbO_3$ described above.

By the presence of Cu in grains and/or grain boundaries, the bonding strength between the crystal grains becomes strong, and the mechanical strength of the piezoelectric composition can be enhanced.

The piezoelectric composition according to the embodiment may contain the other components besides the above described components. For example, at least one metal element of the transition metal elements (elements of Groups 3 to 11 in the long-period periodic table) other than the above described Nb, Mn and Cu, the alkaline earth metal elements, the Group 12 elements in the long-period periodic table and the Group 13 elements in the long-period periodic table may be contained.

In concrete, the transition metal elements excluding rare earth elements exemplify chromium (Cr), iron (Fe), cobalt (Co), nickel (Ni), tungsten (W), and molybdenum (Mo), etc. As the rare earth element, yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm) and ytterbium (Yb), etc. are exemplified.

Alkaline earth metal elements exemplify magnesium (Mg) and strontium (Sr), etc. The Group 12 elements exemplify such as zinc (Zn). The Group 13 metal elements exemplify such as aluminum (Al), gallium (Ga), indium (In), etc.

In the piezoelectric composition according to the embodiment, it is preferable that the complex oxide having a perovskite structure represented by the general formula $ABO_3$ does not substantially include lithium (Li). In particular, it is preferable that Li does not exist as the A site element in the perovskite structure. Specifically, in the compositional formula $(K_xNa_yLi_a)NbO_3$, it is preferable that "x+y+a" satisfies $0.980 \leq x+y+a \leq 1.005$ and "a" is 0.010 or less. This is because Li has a strong volatilization at the time of firing and tends to cause voids in the piezoelectric composition after firing.

In this case, "x+y+a" is more preferably 0.991 or more, and furthermore preferably 0.993 or more. On the other hand, "x+y+a" is more preferably 0.999 or less, furthermore preferably 0.997 or less.

The presence or absence of Li as the A site element in the perovskite structure can be determined such as by whether a peak of an Li included perovskite type compound is detected in an X-ray diffraction pattern obtained by XRD measurement.

Further, although the piezoelectric composition according to the embodiment may include lead (Pb) as an impurity, the content thereof is preferably 1 wt % or less, and Pb is more preferably not contained at all. From the viewpoint of a low pollution, an environment resistance and an ecology, it is possible to minimize a volatilization of Pb at the time of firing, or it is possible to minimize the release of Pb into the environment after an electronic apparatus mounting the piezoelectric element including the piezoelectric composition of the embodiment is being distributed to the market and being disposed.

The average crystal grain size of the crystal grains including the piezoelectric composition according to the embodiment may be controlled from the viewpoint of exhibiting piezoelectric properties and mechanical strength. In the embodiment, it is preferable that the average crystal grain size is, for example, 0.5 μm to 20 μm.

2. Producing Method of Piezoelectric Element

Next, an example of a producing method of the piezoelectric element will be described below.

First, a starting material for the piezoelectric composition is prepared. As a starting material for the complex oxide, compounds including K or compounds including Nb can be used, and if necessary, the compounds including Na can be used. Examples of the compounds including K and the compounds including Na are carbonates, hydrogen carbonate compounds, etc. As the compounds including Nb, oxides are exemplified.

A starting material for manganese may be manganese alone or a manganese included compound. In the embodiment, it is preferably an oxide including manganese. The average particle diameter of the starting material powder for manganese is preferably within the range of 0.1 to 5 μm.

If the piezoelectric composition includes copper, a starting material for copper is prepared. As the starting material for copper, as in the case of manganese, copper alone may be used, or a compound including copper may be used. In the embodiment, an oxide including copper is preferable.

After weighing the starting materials of the prepared complex oxide at a predetermined ratio, mixing is processed for 5 to 20 hours using such as a ball mill. A wet mixing or a dry mixing may be used for the mixing. In the case of wet mixing, the mixed powder is dried. Subsequently, the mixed powder or a green compact obtained by compacting the mixed powder is subjected to a heat treatment (calcination) in the air at 750 to 1050° C. for 1 to 20 hours to obtain calcined powder of the complex oxide.

The complex oxide constituting the obtained calcined powder has a perovskite structure represented by the general formula $KNbO_3$ or $(K,Na)NbO_3$.

When the obtained calcined powder is aggregated, it is preferable to grind the calcined powder for a predetermined time by using such as a ball mill to obtain pulverized powder. The starting material of manganese or the starting materials of manganese and copper, those weighed at a predetermined ratio are added to the calcined powder or the pulverized powder, and the raw material powder of the piezoelectric composition is obtained. The mixing method of the embodiment is preferably a ball mill, a bead mill, etc.

The method for forming the raw material powder of the piezoelectric composition is not particularly limited, and may be appropriately selected according to a desired shape, size, etc. In the case of performing pressing, a predetermined binder and, if necessary, additives are added to the raw material powder of the piezoelectric composition, and the mixture is formed into a predetermined shape to obtain a green compact. Further, the green compact may be obtained by using a granulated powder obtained by adding such as a predetermined binder to the raw material powder of the piezoelectric composition and granulating thereof. If necessary, the obtained green compact may be subjected to further pressure treatment by such as CIP.

A binder removal treatment is applied to the obtained green compact. As the binder removal condition, the holding temperature is preferably 400° C. to 800° C., and the temperature holding time is preferably 2 hours to 4 hours.

Subsequently, the green compact after the binder removal treatment is fired. As the firing conditions, the holding temperature is preferably 950° C. to 1060° C., the temperature holding time is preferably 2 hours to 4 hours, the temperature rising and cooling rate is preferably about 50° C./hour to 300° C./hour, the atmosphere is preferably an oxygen-containing atmosphere. Among the firing conditions, the CV value of the Mn concentration can be controlled by adjusting the holding temperature.

The obtained piezoelectric composition as a sintered body is polished if necessary, an electrode paste is applied and baked to form an electrode. The method for forming the electrodes is not particularly limited, and electrodes may be formed by a vapor deposition, a sputtering, etc.

The sintered body on which the electrode is formed is processed into a predetermined size as necessary, and an electric field of 2 kV/mm to 5 kV/mm is applied to the sintered body for about 5 minutes to 1 hour in oil at a predetermined temperature to pole the sintered body. After the poling processing, a piezoelectric composition in which the spontaneous polarization is aligned in a predetermined direction is obtained.

The piezoelectric composition after the poling processing is processed to a plate-shaped piezoelectric part 1. Next, the electrodes 2 and 3 are formed on the piezoelectric part 1 by such as a vapor deposition, whereby the piezoelectric element shown in FIG. 1 is obtained.

3. Effect in the Embodiment

In the embodiment, an alkali metal niobate based compound having the perovskite structure is employed as a complex oxide included as a main component in the piezoelectric composition, and manganese (Mn) is further included in the piezoelectric composition. The CV value of the Mn concentration is therefore controlled within the above range. When the CV value of the Mn concentration is within the above range, this indicates that a place where Mn is present at a high concentration and a place where Mn is present at a low concentration are mixed in the piezoelectric composition, that is, the concentration distribution of Mn is uneven. In the piezoelectric composition, Mn is hardly solid-solved in crystal grains composed of the alkali metal niobate based compound and is present at a high concentration in grain boundaries formed between the crystal grains.

The concentration distribution of Mn as described above enables Mn to enhance the bonding between crystal grains. As a result, the mechanical strength as the piezoelectric composition improves.

The fired piezoelectric composition is sometimes processed, for example, during producing a piezoelectric element. If the piezoelectric composition does not have a preferable mechanical strength, problems such as chipping and cracking due to insufficient strength of the piezoelectric composition occur during processing, causing defective products. When such defective products are produced, the yield decreases, and a high productivity cannot be realized. In addition, since mechanical displacement and electrical displacement are repeatedly applied to the piezoelectric composition, it needs to have a strength capable of withstanding these displacements. Since the piezoelectric composition according to the embodiment has a preferable mechanical strength, it has a preferable processability, and it can improve the yield and improve the production efficiency of the piezoelectric element. Furthermore, the piezoelectric composition according to the embodiment has an enough strength to withstand repeatedly applied mechanical displacement and electrical displacement.

Further, by setting the CV value of the Mn concentration within the above range, it is possible to increase the electromechanical coupling coefficient $k_{31}$ while maintaining the mechanical strength of the piezoelectric composition. That is, both mechanical strength and piezoelectric properties of the piezoelectric composition can be achieved. Since Mn present in the grain boundaries is a component that does not contribute to the piezoelectric properties, Mn can be efficiently and highly concentrated in the grain boundaries while reducing the Mn content by setting the CV value of the Mn concentration within the above range.

Furthermore, the mechanical strength of the piezoelectric composition can be further enhanced by including Cu as the subcomponent of the complex oxide.

4. Modified Embodiments

In the embodiment described above, the piezoelectric element in which the piezoelectric part is a single layer has been described, but a piezoelectric element having a structure in which piezoelectric parts are laminated may be used. Further, a piezoelectric element having a combination of these may be used.

Figure 2:
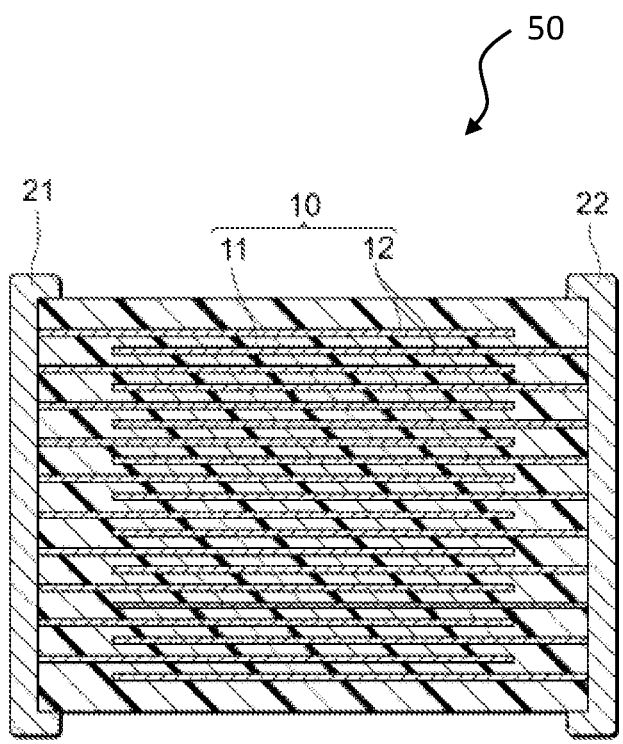
FIG. 2 is a schematic cross sectional view of another example of the piezoelectric element according to the embodiment.

As the piezoelectric element having a structure in which piezoelectric parts are laminated, for example, the piezoelectric element 50 shown in FIG. 2 is exemplified. This piezoelectric element 50 includes a laminate 10 in which multiple piezoelectric layers 11 made of the piezoelectric composition according to the embodiment and multiple internal electrodes 12 are alternately laminated. A pair of terminal electrodes 21 and 22 are formed on both end parts of the laminate 10 to be electrically connected to the internal electrode layers 12 alternately arranged inside the laminate 10.

The thickness (an interlayer thickness) per one layer of the piezoelectric layers 11 is not particularly limited, and can be set arbitrarily according to desired properties, use, etc. Usually, the interlayer thickness is preferably about 1 μm to 100 μm. The number of layers of the piezoelectric layer 11 is not particularly limited, and can be arbitrarily set according to desired properties, use, etc.

As a method of producing the piezoelectric element 50 shown in FIG. 2, a known method may be used. For example, a green chip to be the laminate 10 shown in FIG. 2 is prepared and fired to obtain a laminate 10. Then, terminal electrodes are printed or transferred to the laminate 10 and fired thereof. A general printing method and a sheet method each using paste are exemplified as methods for producing the green chip. In the printing method and the sheet method, a green chip is formed by using a paste prepared by mixing raw material powders of the above described piezoelectric composition and a vehicle in which a binder is dissolved in a solvent and forming a paint.

Although the embodiment of the invention has been described above, the invention is not limited to the above embodiments and modifications may be made in various aspects within a scope of the invention.

EXAMPLE

Hereinafter, the invention will be described in more detail using examples and comparative examples. However, the invention is not limited to the following examples.

First, powder of potassium hydrogen carbonate ($KHCO_3$), powder of sodium hydrogen carbonate ($NaHCO_3$) and powder of niobium oxide ($Nb_2O_5$) were prepared as starting materials for the complex oxide (($K_xNa_y$)$NbO_3$). Powder of manganese oxide ($MnO_2$) and powder of copper oxide (CuO) were also prepared as starting materials for manganese (Mn) and copper (Cu) included in the piezoelectric composition.

The prepared starting materials were weighed so that the piezoelectric composition after firing (sintered body) had the composition shown in Table 1. Each weighed powder of $KHCO_3$, $NaHCO_3$ and $Nb_2O_5$ were mixed by a ball mill for 16 hours, subsequently dried at 120° C., and obtained mixed powder. The obtained mixed powder was pressed to compact the mixed powder, calcined at 1000° C. for 4 hours, and obtained a calcined body of the complex oxide. Subsequently, the calcined body was pulverized by a ball mill for 16 hours and obtained pulverized powder.

Each weighed powder of CuO and $MnO_2$ was added to the obtained pulverized powder, mixed by a ball mill for 16 hours, subsequently dried at 120° C., and obtained raw material powder of the piezoelectric composition. PVA as a binder was added to the obtained raw material powder of the piezoelectric composition and granulated thereof by a known method. Next, the obtained granulated powder was pressed by a pressing machine under a load of 196 MPa and obtained a plate-shaped green compact.

The plate-shaped green compact thus obtained was subjected to a binder removal treatment at 550° C. for 2 hours. The green compact after the binder removal treatment was fired under air at 1050° C. for 2 hours and obtained a piezoelectric composition (a sintered body).

The obtained sintered body was polished to obtain a parallel plate shape having a thickness of 1.0 mm, silver paste was printed on both sides of the parallel plate shaped sintered body, baked thereof at 800° C. and provided facing electrodes of silver. The sintered body was then cut into a length of 12 mm and a width of 3 mm by a dicing saw. Finally, an electric field of 3 kV/mm was applied to the sample in silicone oil at 150° C. for 5 minutes to pole the piezoelectric composition, and piezoelectric composition samples (Sample Nos. 1 to 19) were obtained.

The CV value, the mechanical strength and the electromechanical coupling coefficient $k_{31}$ were measured in the following manner with respect to the obtained samples.

The CV value was calculated as follows. First, the obtained sample was cut, and an area analysis was performed on the field of view at 500 times magnification on the cut surface using an EMPA apparatus attached to a SEM (Scanning Electron Microscope). Based on information of the Mn content (the Mn concentration) obtained by the area analysis, the standard deviation σ of the Mn concentration and the average value Av of the Mn concentration were calculated, and the CV value was calculated by the following equation.

$$CV \text{ value } (\%) = 100(\sigma/Av)$$

In the example, it was judged preferable when a sample has a CV value of 35% or more and 440% or less. The results are shown in Table 1.

The mechanical strength was measured as follows. The piezoelectric composition (sintered body) was processed into a length of 7.2 mm, a width of 2.5 mm, and a thickness of 0.32 mm using a double-sided lapping machine and a dicing saw to obtain a sample for measuring the mechanical strength. The maximum load (N), when the sample for measuring the mechanical strength was broken by a three-point bending with a distance between supporting points of 5 mm, was measured using 5543 manufactured by INSTRON for each 20 samples. The mechanical strength was then calculated. In the example, in consideration of practical processability, it was judged preferable when a sample has a mechanical strength of 80 MPa or more.

Further, the electromechanical coupling coefficient $k_{31}$ was calculated by measuring the resonance frequency fr and the anti-resonance frequency fa at room temperature using an impedance analyzer 4294A (manufactured by KEYSIGHT TECHNOLOGIES) according to JEITA EM-4501M of Japan Electronics and Information Technology Industries Association standard. In the example, it was judged preferable when a sample has $k_{31}$ of 14.0% or more. The results are shown in Table 1.

TABLE 1

| Sample No. | (K$_x$Na$_y$)NbO$_3$ x | y | x + y | Component Mn z (mol %) | Cu n (mol %) | CV value of Mn concentration (%) | Properties Mechanical strength (MPa) | electromechanical coupling coefficient k$_{31}$ (%) |
|---|---|---|---|---|---|---|---|---|
| 1 | 0.995 | 0.000 | 0.995 | 0.10 | — | 35 | 85 | 19.3 |
| 2 | 0.995 | 0.000 | 0.995 | 0.50 | — | 170 | 95 | 18.5 |
| 3 | 0.995 | 0.000 | 0.995 | 0.80 | — | 250 | 100 | 17.9 |
| 4 | 0.980 | 0.000 | 0.980 | 1.60 | — | 300 | 105 | 15.0 |
| 5 | 0.991 | 0.000 | 0.991 | 1.60 | — | 290 | 105 | 17.3 |
| 6 | 0.993 | 0.000 | 0.993 | 1.60 | — | 300 | 110 | 17.5 |
| 7 | 0.995 | 0.000 | 0.995 | 1.60 | — | 310 | 115 | 17.8 |
| 8 | 0.997 | 0.000 | 0.997 | 1.60 | — | 310 | 115 | 17.2 |
| 9 | 0.999 | 0.000 | 0.999 | 1.60 | — | 300 | 110 | 17.0 |
| 10 | 1.005 | 0.000 | 1.005 | 1.60 | — | 300 | 105 | 14.2 |
| 11 | 0.995 | 0.000 | 0.995 | 2.00 | — | 360 | 125 | 16.3 |
| 12 | 0.995 | 0.000 | 0.995 | 2.50 | — | 440 | 130 | 14.5 |
| 13 | 0.805 | 0.190 | 0.995 | 1.60 | — | 300 | 110 | 19.0 |
| 14 | 0.500 | 0.495 | 0.995 | 1.60 | — | 280 | 100 | 22.7 |
| 15 | 0.995 | 0.000 | 0.995 | 0.10 | 0.50 | 40 | 100 | 18.1 |
| 16 | 0.995 | 0.000 | 0.995 | 0.50 | 0.50 | 180 | 115 | 17.6 |
| 17* | 0.995 | 0.000 | 0.995 | 0.00 | — | not detected | 75 | 24.1 |
| 18* | 0.400 | 0.600 | 1.000 | 1.60 | — | 335 | 75 | 21.5 |
| 19* | 0.995 | 0.000 | 0.995 | 3.20 | — | 630 | 130 | 13.0 |

*in the table indicates a comparative example

From Table 1, it was confirmed that both preferable mechanical strength and preferable electromechanical coupling coefficient k$_{31}$ can be achieved by setting the CV value of the Mn concentration in the alkali metal niobate based compound having a perovskite structure within the above range.

Furthermore, it was confirmed that both mechanical strength and electromechanical coupling coefficient k$_{31}$ can be achieved at higher levels by setting "x" and "y" in the compositional formula (K$_x$Na$_y$)NbO$_3$ within the above range. Further, it was confirmed that the mechanical strength can be further enhanced by setting the Cu content within the above range.

Since the piezoelectric composition according to the invention can satisfy both a high mechanical strength and a preferable piezoelectric property, it can be suitably used for piezoelectric elements in various fields.

DESCRIPTION OF REFERENCE NUMERAL

5 . . . Piezoelectric element
1 . . . Piezoelectric part
2, 3 . . . Electrodes
50 . . . Piezoelectric element
10 . . . Multilayer body
11 . . . Piezoelectric layer
12 . . . Internal electrode layer
21, 22 . . . terminal electrodes

What is claimed is:

1. A piezoelectric composition comprising manganese and a complex oxide having a perovskite structure represented by compositional formula (K$_x$, Na$_y$)NbO$_3$, wherein
   x and y in the compositional formula satisfy $0.800 \leq x \leq 1.005$, $y \leq 0.190$, and $0.980 \leq x+y \leq 1.005$,
   a concentration distribution of the manganese has a variation, and
   the variation shows a CV value of 35% or more and 440% or less.

2. The piezoelectric composition according to claim 1, wherein
   the manganese is included in z mol % in terms of MnO$_2$ with respect to 1 mol of the complex oxide, and
   z satisfies $0.50 \leq z \leq 2.50$.

3. The piezoelectric composition according to claim 1 comprising copper, wherein
   the copper is included in n mol % in terms of CuO with respect to 1 mol of the complex oxide, and
   n satisfies $0.20 \leq n \leq 0.80$.

4. A piezoelectric element including the piezoelectric composition according to claim 1.

5. The piezoelectric composition according to claim 2 comprising copper, wherein
   the copper is included in n mol % in terms of CuO with respect to 1 mol of the complex oxide, and
   n satisfies $0.20 \leq n \leq 0.80$.

6. A piezoelectric element including the piezoelectric composition according to claim 2.

7. A piezoelectric element including the piezoelectric composition according to claim 3.

8. A piezoelectric element including the piezoelectric composition according to claim 5.

* * * * *